United States Patent [19]

Anderson

[11] Patent Number: 5,790,750
[45] Date of Patent: Aug. 4, 1998

[54] PROFILED SUBSTRATE HEATING UTILIZING A SUPPORT TEMPERATURE AND A SUBSTRATE TEMPERATURE

[75] Inventor: Roger N Anderson, San Jose, Calif.

[73] Assignee: Applied Materials, Inc., Santa Clara, Calif.

[21] Appl. No.: 551,926

[22] Filed: Oct. 20, 1995

Related U.S. Application Data

[63] Continuation of Ser. No. 145,446, Oct. 29, 1993, abandoned.

[51] Int. Cl.$^6$ .................................................. H01L 21/26
[52] U.S. Cl. .......................... 392/416; 219/290; 219/411; 118/725; 427/557
[58] Field of Search .................................. 392/416, 418; 219/405, 411, 390; 118/724, 725, 50.1; 437/247, 248; 427/585, 542, 557, 521; 364/557

[56] References Cited

U.S. PATENT DOCUMENTS

| | | | |
|---|---|---|---|
| 3,836,751 | 9/1974 | Anderson | 219/411 |
| 4,680,451 | 7/1987 | Gat et al. | 219/411 |
| 4,836,138 | 6/1989 | Robinson et al. | 219/405 |
| 4,886,954 | 12/1989 | Yu et al. | 219/390 |
| 4,924,073 | 5/1990 | Chiba | 219/411 |
| 5,108,792 | 4/1992 | Anderson et al. | 427/248.1 |
| 5,154,512 | 10/1992 | Schietinger et al. | 392/416 |
| 5,179,677 | 1/1993 | Anderson et al. | 392/411 |
| 5,418,885 | 5/1995 | Hauser et al. | 392/41.6 |
| 5,603,772 | 2/1997 | Ide | 118/724 |
| 5,650,082 | 7/1997 | Anderson | 219/390 |

FOREIGN PATENT DOCUMENTS

| | | | |
|---|---|---|---|
| 284858 | 10/1988 | European Pat. Off. | |
| 62-15817 | 1/1987 | Japan | 437/247 |
| 62-20308 | 1/1987 | Japan | 437/247 |
| 62-46516 | 2/1987 | Japan | 437/248 |
| 63-186424 | 8/1988 | Japan | |
| 63-285925 | 11/1988 | Japan | |
| 3-28376 | 2/1991 | Japan | |
| 3-145121 | 6/1991 | Japan | 437/247 |

*Primary Examiner*—John A. Jeffery

[57] ABSTRACT

An apparatus and method for thermal processing, and more particularly for rapid thermal processing wherein a first thermal radiator generates and projects a first pattern of thermal radiation onto a first surface of a substrate, and wherein a second thermal radiator generates and projects a second pattern of thermal radiation onto a second surface of the substrate. The temperatures on the first and second surfaces are sensed by temperature sensors. A mechanism for selectively controlling the first and second thermal radiators in response to the temperature sensors causes a prescribed temperature profile to be produced within the substrate.

16 Claims, 8 Drawing Sheets

PROFILED SUBSTRATE HEATING UTILIZING A SUPPORT TEMPERATURE AND A SUBSTRATE TEMPERATURE

CROSS REFERENCE TO RELATED APPLICATION

This application is a continuation of patent application Ser. No. 08/145,446, entitled "Profiled Substrate Heating", filed on Oct. 29, 1993, abandoned.

FIELD OF THE INVENTION

The present invention relates to heaters useful in thermal processing apparatus, and more particularly to heaters used in the rapid thermal processing of semiconductor substrates during chemical vapor deposition (CVD) processes, including epitaxial reaction processes

BACKGROUND

It will be understood that when reference is made in the remainder of this application to CVD or epitaxial deposition processes, these are merely prime examples of the range of thermal processes to which the teachings of the present invention are applicable.

The commercial production of semiconductor devices has in recent times been placed under increasing pressure to reduce the production cost. This in turn has required new measures to increase the efficiency of epitaxial processing methods so that they yield higher throughput of acceptable devices at a lower cost per device. One important recent development in this regard is a compact, double-dome reactor which achieves increased processing speed and reduced consumption of the gases used in the epitaxial reaction.

Such an apparatus is fully detailed by Anderson et al. in U.S. Pat. No. 5,108,792, incorporated herein by reference and hereinafter referred to as the '792 patent. The central concepts of this double-dome reactor system may be summarized as follows: (1) substrate support on a thin, low-mass susceptor for rapid heating and cooling; (2) substrate and susceptor enclosure in a compact housing having a pair of transparent domes, each dome covering one face of the susceptor-substrate combination; (3) conduits for reactant gases to enter and exit the housing; and (4) a pair of radiant heaters arranged to project thermal radiation through each of the transparent domes to uniformly heat each face of the susceptor-substrate combination.

While the reactor system described in the '792 patent has proven very efficient in reducing processing cost and increasing throughput, work has continued on further improvements in these regards. The radiant heaters shown and described in the '792 patent use a pair of concentric arrays of heater lamps in a simple cylindrical reflector housing, one lamp array near the outer periphery and the other nearer the center of the cylindrically symmetric arrangement. The two arrays use different types of lamps having different radiation patterns, as shown in the drawing of the '792 patent.

Such an arrangement achieves good radial uniformity of thermal radiation from the center to the edge of the substrate, while rotation of the substrate about the axis of cylindrical symmetry effectively cancels any azimuthal non-uniformities of radiation. However, achieving similar radial uniformity of thermal radiation without requiring two concentric arrays of heater lamps of two different types is very desirable, since the cost of the heaters could be reduced.

A compact double-dome reactor that achieves radial uniformity without requiring two concentric arrays of heater lamps of two different types is shown by Anderson et al. in U.S. Pat. No. 5,179,677, incorporated herein by reference and hereinafter referred to as the '677 patent. The apparatus of the '677 patent uses a plurality of linear, tubular heater lamps arranged in a concentric radial array about an axis along which thermal radiations are directed toward the substrate. Some of the lamps are provided with focussing reflectors that cause thermal radiation to be directed in parallel paths emanating from the focusing reflectors toward the substrate—the result being that greater thermal radiation is directed at the center of the substrate. The remainder of the lamps are provided with dispersive reflectors that cause thermal radiation to be dispersed in a hemispherical radiation pattern. A peripheral reflector circumferentially surrounds the lamps and their associated reflectors so as to intercept some of the dispersed radiation. The peripheral reflector redirects the radiation it intercepts into a radiation pattern that is more intense at the periphery of the substrate than at the center. The result is a pattern of radiation from the lamps with focusing reflectors that is balanced across the substrate. The reactor of the '677 patent achieves improved radial uniformity of thermal radiation from the center to the edge of the substrate without using two concentric arrays of different type heater lamps, while rotation of the substrate about the axis of cylindrical symmetry effectively cancels any azimuthal nonuniformities of radiation. It is known to use a temperature sensor directed at the bottom of the susceptor of the '677 patent and, through a servo loop, to control both lamp arrays.

However, beyond the teachings of the '677 and '792 patents, selective control of patterns of radiation directed to the upper and lower surfaces of the susceptor-substrate combination to produce a controlled uniform or predetermined axial heating of and temperature profile for the substrate is very desirable for several reasons. First, during temperature ramp up, which occurs when the substrate is heated from, e.g., room temperature to CVD processing temperatures, if heat is applied equally to upper and lower surfaces of the susceptor-substrate combination, the substrate will heat much more rapidly on its upper surface, i.e., the surface exposed directly to thermal radiation, than on its lower surface, i.e., the surface that is in contact with the susceptor. This is because the susceptor blocks direct radiation to the lower surface of the substrate and has a sufficient mass, a sufficient lack of thermal conductivity and a sufficiently small thermal heat transfer coefficient, to delay the application and reduce the amount of heat applied to the lower surface of the substrate from the lower heater lamps. In addition, a center portion of the upper surface of the susceptor will be blocked by the substrate from receiving thermal radiation from the upper heater lamps. As a result, the susceptor will heat much more slowly in its blocked center portion, than in its unblocked peripheral portion. Hence, the substrate will initially be hotter than that portion of the susceptor that is adjacent to and blocked by the substrate. Then as the susceptor-substrate combination heats to the CVD processing temperature, the substrate tends to follow the temperature of the susceptor, and, as a result, the substrate will develop an undesired radial temperature gradient or profile wherein the center of the substrate will tend to be cooler than its periphery. Since a uniform steady state temperature profile is generally desired for substrate processing, the processing of the substrate must wait for a cooling and equalizing of the temperature within the substrate, which can take several minutes to achieve. Thus, a selective control of the radiation patterns applied to the upper and lower surfaces of the susceptor-substrate combination which maintains uniform temperature ramping and a uniform temperature profile within the substrate ramp up is desired. The axial heat transfer tends to produce a small axial gradient within the wafer and within the susceptor, with a larger temperature difference between the wafer and susceptor due to thermal contact resistance at the interface.

A second problem that could be addressed by a system capable of achieving axial and radial uniformity of temperature within a substrate is that of gas flow effect. In the process chamber used for CVD processes, the resulting deposition layer uniformity may be affected by the flow of a deposition gas stream. Certain gas species, such as trichlorosilane may be depleted due to deposition at the surface or dilution by other flowing gasses. Advantageously, such non-uniformities may be compensated for by producing a non-uniform temperature profile (or gradient), both radially and axially, that compensates for the flow effect.

Third, the problem of stress induced slip deformation of a substrate can be caused by non-uniform temperature profiles in the substrate during heating or cooling.

A substrate that is hotter at its periphery than at its center will be subjected to a compressive stress at its outer edge. Similarly, a substrate that is hotter at its center than at its periphery will be subjected to compressive stress at its center. A system capable of achieving a controlled radial temperature profile in a substrate may control such stress induced slip.

Finally, it is known that atoms can be transferred by a temperature gradient if the temperature gradient is selectively controlled. This phenomenon can be utilized to cause a coating to be transferred to the substrate, or to prevent the transfer of atoms between the susceptor and the substrate. Again, a system capable of selectively achieving predetermined axial temperature gradients in a substrate/susceptor combination may be desired to control the transfer of atoms between a susceptor and a substrate.

Thus, improvements are needed in heater systems used in thermal processing, particularly in the rapid thermal processing of semiconductor substrates during chemical vapor deposition (CVD) processes, including epitaxial reaction processes. The present invention advantageously addresses the above and other needs.

SUMMARY OF THE INVENTION

The present invention advantageously provides an apparatus and method for thermal processing, and more particularly for rapid thermal processing of semiconductor substrates during, for example, chemical vapor deposition (CVD) including epitaxial deposition.

The apparatus of the present invention may be characterized as an apparatus for generating a predetermined temperature profile (or gradient) in a substantially planar substrate supported on a heat transferring susceptor. The apparatus includes a radiant heat source generating a first pattern of thermal radiation and projecting the first pattern of thermal radiation onto an upper exposed surface of the substrate and susceptor. A second radiant heat source generates a second pattern of thermal radiation and projects the second pattern of thermal radiation onto an underside of the susceptor for transfer to a lower surface of the substrate. Temperature sensors monitor the temperature on the upper surface of the substrate and underside of the susceptor, and a controller regulates the first and second radiant heat sources in response to the sensed temperature so as to produce the predetermined temperature profile within the substrate or the susceptor.

The present invention may also be characterized as a method for generating a prescribed thermal profile in a planar substrate including a first step of (a) interposing the substrate on a planar susceptor between first and radiant heat sources such that upper faces of the substrate and susceptor are oriented toward the first heat source, and an underside of the susceptor is oriented toward the second heat source. The next steps are (b) irradiating the upper faces of the substrate and susceptor with a first radiant thermal energy pattern using the first heat source and (c) irradiating the underside of the susceptor with a second radiant thermal energy pattern using the second heat source.

Also (d) during the irradiating of steps (b) and (c), the temperature on least one of the faces is sensed. Finally, the method includes the step of (e) adjusting the first and second radiant energy patterns with which the substrate and susceptor are irradiated in response to the sensing in step (e) so that the predetermined and prescribed thermal profile is generated within the substrate.

It is thus a feature of the invention to generate and maintain the prescribed temperature profile within the substrate.

It is another feature of the invention to generate such temperature profile by sensing and, in response thereto, adjusting relative amounts of the thermal energy delivered to opposite planar surfaces of the substrate to provide: (1) a controlled ramping of the temperature of the substrate during its initial heating, or (2) an axial and radial uniformity of temperature within a substrate to control gas flow effects, or (3) a controlled radial temperature profile within a substrate to control stress induced slip, or (4) a controlled temperature gradient within a substrate to control the transfer of atoms between a susceptor and a substrate.

DETAILED DESCRIPTION OF THE PREFERRED EMBODIMENTS OF THE INVENTION

Figure 1:
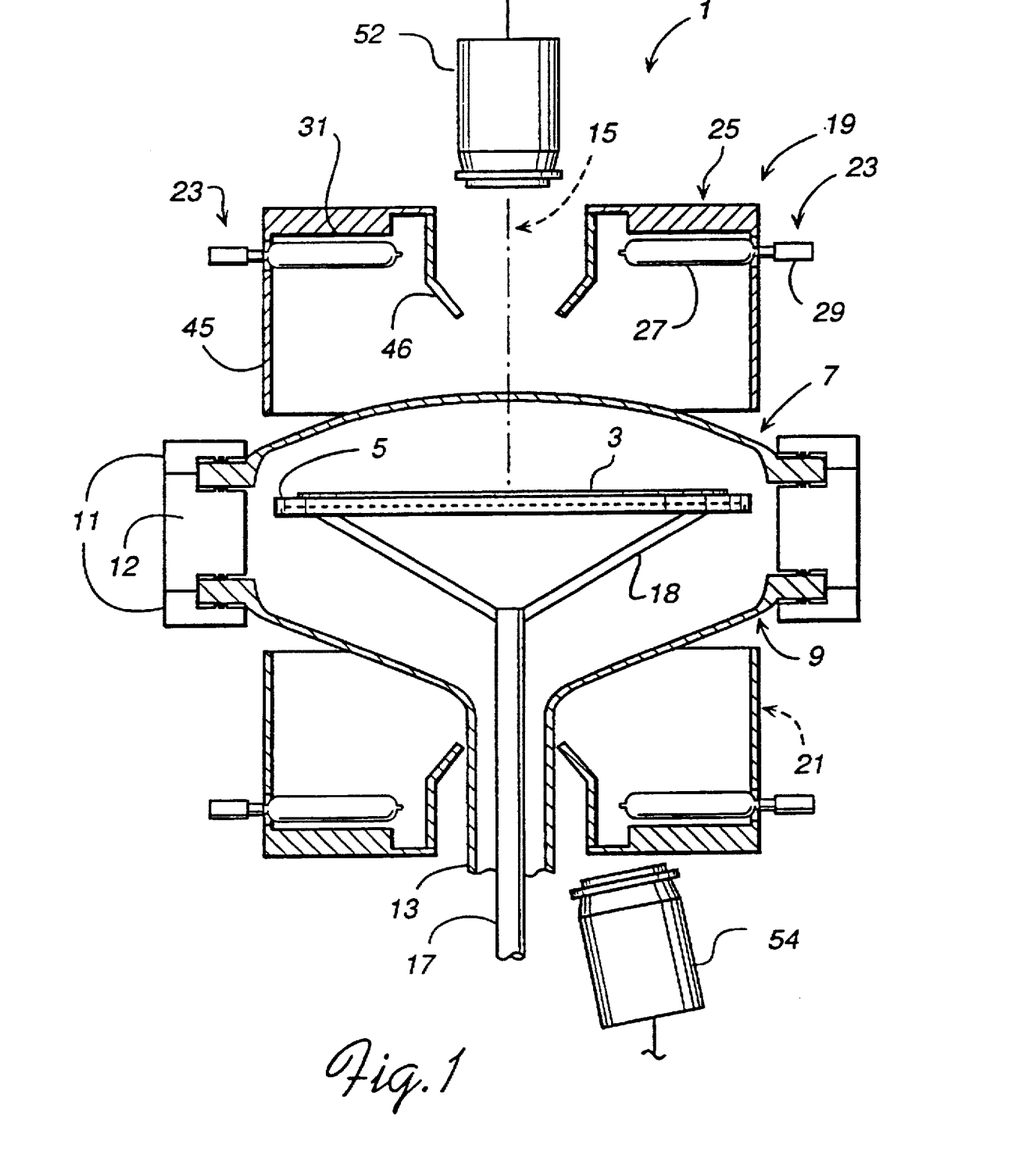
FIG. 1 is a side view, partly in elevation and partly in section, of a chemical vapor deposition (CVD) apparatus to which present invention can be applied.

Referring first to FIG. 1, a chemical vapor deposition (CVD) reactor chamber or other rapid thermal processing apparatus 1 is illustrated in a simplified and somewhat schematic form. A planar semiconductor substrate 3, which might be a thin wafer of silicon having a diameter of 200 mm, for example, is supported on a substantially planar susceptor 5 mounted within the processing chamber within reactor chamber 1. Susceptor 5 is made, for example, of graphite and is in the form of a thin disc such that it has a relatively low thermal mass.

An upper domed cover 7 made of a transparent refractory material such as quartz, for example, encloses the top surface of the substrate 3 and susceptor 5, while a similar lower domed cover 9 encloses the bottom surface thereof. Edge flanges 11 and 12, illustrated in a simplified schematic form, are used to join the covers 7 and 9, forming a gas-tight joint.

Although each of the domed covers 7 and 9 might be provided with a tubular neck as in the aforementioned double dome system of the '792 patent, only the lower cover 9 has been illustrated with a tubular neck 13 located on the axis 15 of cylindrical symmetry of the apparatus. The neck 13 is normally connected to a source of purge gas but may alternatively be connected to a vacuum pump or to a source of desired reactive gas to be introduced into the reactor. Ports (not shown) in edge flange 12, similar to those in the '792 patent, are similarly used to control the gaseous environment within the reaction chamber by the horizontal flow of the gases.

A support shaft 17 extends upwardly within the neck 13 of the lower cover 9 along the vertical axis 15 to support susceptor 5 and substrate 3 on conically extending spokes 18. The shaft 17 may be rotated during processing operations by a motor (not shown).

A heater apparatus 19 is positioned adjacent to the upper cover 7 for the purpose of heating the upper surface of the substrate 3 and susceptor 5 during processing. The upper heater apparatus 19 projects thermal radiation in a direction generally downwardly along the vertical axis 15. A similar lower heater apparatus 21 (shown only in phantom outline) is positioned adjacent to lower cover 9 for the purpose of heating the underside of the susceptor 5 and by heat transfer through susceptor, the under or lower surface of the substrate 3. The heaters 19 and 21 thus combine to heat the substrate 3 and susceptor 5 to processing temperatures in the range of 500° to 1200° C.

Considered in its simplest and broadest aspect, each heater apparatus 19 or 21 consists of a circumferentially arranged array of spaced and radially extending heat lamps 23 and a circumferentially arranged extended reflector array 25. The heat lamps 23 extend radially inwardly toward the vertical axis 15 through corresponding apertures in the outer wall of the extended reflector array 25. Each of the heat lamps 23 consists of a linear halogen-quartz tube 27 with a tungsten filament and a socket 29 which provides mechanical support and electrical connections to the lamp 27.

Upper focusing reflectors 31 are disposed above some but not all of the lamps 27 while unillustrated dispersive reflectors are disposed above the remainder of the lamps 27. As explained in the '677 patent, independent powering of the lamps with focusing reflectors and those with dispersive reflectors allows control of the radial distribution of radiant heating.

The radiation pattern produced on substrate 3 is considerably influenced by the incorporation of a peripheral reflector 45 in the shape of a cylinder having its axis generally coincident with vertical axis 15. The peripheral reflector 45 is thus positioned to intercept a considerable percentage of the rays traveling along paths which deviate from a direction parallel to vertical axis 15, and to redirect a large percentage of these rays onto substrate 3. Inner reflector 46 also intercepts and redirects deviate rays.

The peripheral reflector 45 further increases the complexity of analysis of the radiation pattern produced on substrate 3, but empirical results show the following:

(1) The radiation intensity produced by heater lamps 23 with focusing reflectors 31 is higher in the center region of substrate 3 than in the peripheral region thereof. This is consistent with the fact that a substantial percentage of the radiation from the focusing reflectors is beamed toward the substrate.

(2) The radiation intensity produced by heater lamps 23 with dispersive reflectors is greater in the peripheral region of substrate 3 than in the center region thereof. This is consistent with the greater percentage of rays which diverge from a direction parallel to the vertical axis 15 in FIG. 1. Many of these rays impinge on the peripheral reflector 45 and are reflected into a pattern of high radiation density in the peripheral region of the substrate 3.

Figure 2:
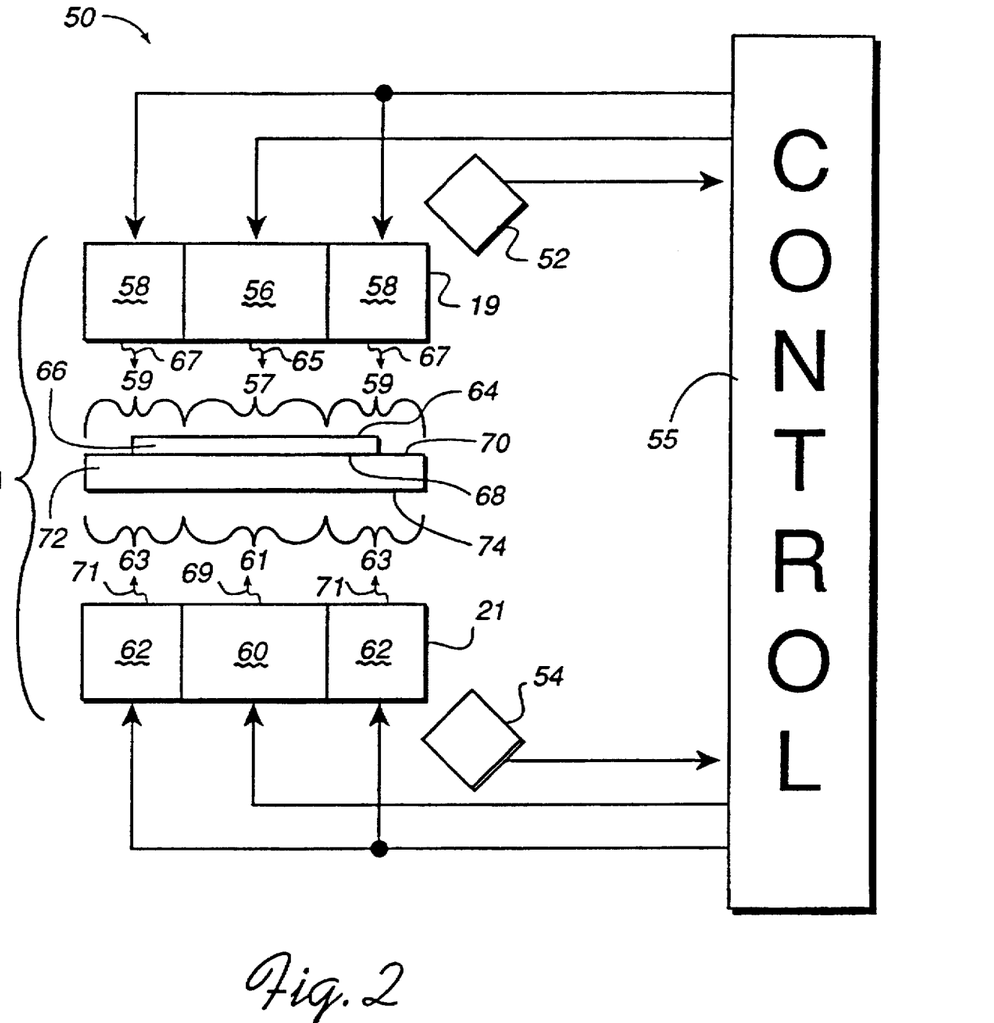
FIG. 2 is a schematic block diagram showing an apparatus made in accordance with the present invention, wherein the CVD apparatus of FIG. 1 is shown coupled to upper and lower sensors and a control system.

Referring next to FIG. 2, a schematic block diagram is shown of an apparatus 50, wherein the thermal processing apparatus 1 of FIG. 1 is shown coupled to upper and lower sensors 52 and 54 and a control system 55. The upper heater apparatus 19 and lower heater apparatus 21 are shown each divided into inner and outer temperature control zones, or bias regions 56, 58 and 60, 62 respectively (to which they are referred in the '677 patent). It is however noted that the heater lamps 23 providing the various bias regions 56, 58, 60, and 62 are disposed at the same radial positions and the dispersive or focusing reflectors provide the radial separation between the sets of heater lamps 23.

Figure 3:
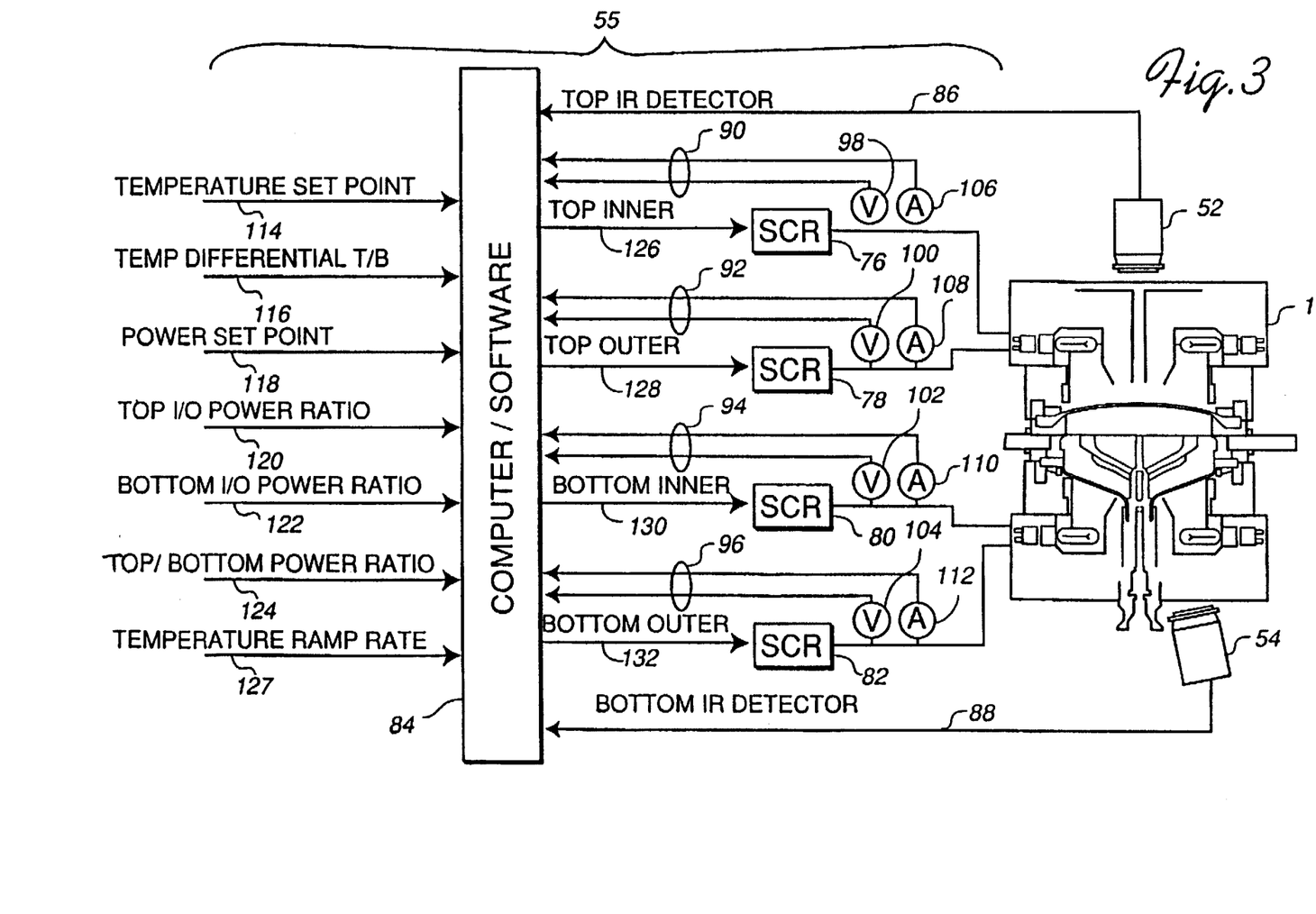
FIG. 3 is a detailed block diagram showing the apparatus of FIG. 2, and detailing components of the control system.

The upper heater 19 is directed at an upper surface 64 of a substrate 66, which is supported on its lower surface 68 by an upper surface 70 of a susceptor 72. The lower heater 21 is directed at an underside or lower surface 74 of the susceptor 70. The sensors 52 and 54 are positioned as illustrated in FIG. 3 and sense the temperatures of respective ½-inch (1.3 cm) beam spots at the center of the substrate upper surface and at a position offset 1.8 inches (4.6 cm) from the center of the susceptor bottom. Because the susceptor 5 is supported on its circumference by a number of spokes 18 conically extending from the hub 17, the lower temperature sensor 54 needs to be synchronized with the spokes 18 so as to sense only the planar underside of the susceptor 5. The sensors 52 and 54 are infrared radiant energy sensors, often called pyrometers, available from, e.g., Ircon, Inc. of Niles, Ill., and are coupled to the control system 55.

In a simplified description of operation, the upper surface 64 of the substrate 66 is irradiated by the upper heater 19, and the lower surface 74 of the susceptor 72 is irradiated by the lower heater 21. Note that because the substrate 66 covers only a center portion of an upper surface 70 of the susceptor 72, the periphery of the upper surface 70 of the susceptor 72 is also irradiated by the upper heater 19. The inner and outer temperature control zones 56 and 58 of the upper heater 19 and zones 60 and 62 of the lower heater 21 irradiate neighboring inner and outer temperature control zones 57 and 59 on the upper surface of the substrate 64, and 61 and 63 on the lower surface of the susceptor 74. As illustrated, the upper, inner and outer zones 57 and 59 are irradiated with first and second radiant thermal radiations 65 and 67, while the lower, inner and outer zones 61 and 63 are irradiated with radiant thermal radiations 69 and 71 respectively. Note that the upper/outer temperature control zone 58 of the upper heater 19 also heats the exposed periphery of the upper surface of the susceptor 70, and thus the exposed periphery is included in the upper/outer temperature control zone 59 of the upper surface of the substrate 64. However, in actual practice, the upper, inner zone 57 receives most of its heat from the inner temperature control zone 56 but receives some heat from the outer temperature control zone 58 while the situation is reversed for the upper, outer zone 59.

The control system 55 controls the amount of power delivered to the heater lamps 23 of the inner and outer temperature control zones 56, 58, 60 and 62 of the upper and lower heat lamps 19 and 21. The heater lamps 23 with dispersive reflectors preferentially irradiate the outer temperature control zone 59 and 63 while the heater lamps 23 with focusing reflectors preferentially irradiate the inner temperature control zones 57 and 61. Thus, the apparatus of FIG. 2 has effectively four temperature control zones: upper-inner 56, upper-outer 58, lower-inner 60, and lower-outer 62. As a result, the four-zone heating of the '677 patent more effectively controls the temperatures in the temperature control zones 57, 59, 61 and 62 on the surfaces of the substrate 66 and susceptor 72.

The control system 55 is responsive to the upper and lower sensors 52 and 54. The sensors provide upper and lower sensor signals indicative of the temperatures sensed on the upper surface of the substrate and the underside of the susceptor, respectively. As described more completely below, the control system controls the delivery of power to the heaters in response to the sensor signals.

Referring next to FIG. 3, a detailed block diagram of the CVD apparatus 1, the upper and lower sensors 52 and 54 and the control system 55 is shown with control signals appropriate for a constant power mode of operation. The heater lamps that preferentially irradiate each of the four temperature control zones are coupled to respective silicon controlled rectifier circuits (SCRs) 76, 78, 80 and 82. The SCRs 76, 78, 80 and 82 each receive a respective power control signal from a processor 84 within the control system 55. As used herein, the term SCR is used to refer to a silicon controlled rectifier-based circuit (or semiconductor controlled rectifier-based circuit) that includes an SCR and supporting components needed to provide the power control functions described herein, e.g., fixed resistors, a variable resistor (or potentiometer) and a diode. One example of an appropriate SCR circuit has an analog voltage control input and a phase-angle control output. Such SCR circuits are known in the art to be effective control circuits for controlling RMS current and therefore the delivery of power to a load—in this case the heater lamps.

The processor 84 (which may comprise a VME-based single-board computer based on the Motorola 68030 processor, which is programmed by the software specified by FIGS. 6-9 herein) generates the power control signals in response to various input signals including the temperature sensor signals 86 and 88. The processor 84 may also receive and/or generate a temperature set point 114, a top/bottom temperature differential 116, a power set point 118, a top inner/outer power differential 120, a bottom inner/outer power differential 122, a top/bottom power differential 124, and a temperature ramp rate 127 as explained more completely below.

The temperature set point 114 indicates the temperature at which the substrate 66 or susceptor 72 is to be heated by the heaters 19 and 21. The temperature differential 116 indicates of the desired difference in temperature between the upper surface of the substrate 66 and the lower surface of the susceptor 72. For one of the described modes, the substrate 66 is kept at a somewhat lower temperature than the back of the susceptor 72. The power set point 118 indicates the desired overall power to be consumed by the heaters 19 and 21 (FIG. 2). The top inner/outer power ratio 120 indicates of a desired ratio of power between the inner and outer temperature control zones 56 and 58 (FIG. 2) of the upper heater 19. The bottom inner/outer power ratio 122 indicates a desired ratio of power between the inner and outer temperature control zones 60 and 62 (FIG. 2) of the lower heater 21 (FIG. 2). The top/bottom power ratio 124 indicates a desired ratio of power between the upper and lower heaters 19 and 21. Finally, the temperature ramp rate 127 indicates a desired rate of change of the temperature set point 114 during temperature ramping.

In addition, the processor 84 receives current and voltage signals 90, 92, 94, and 96 that indicate the amount of power that is actually being consumed by the heater lamps of each of the temperature control zones. The current and voltage signals 90, 92, 94, and 96 are generated by power measurement circuits that include voltage detectors 98, 100, 102, and 104 and current detectors 106, 108, 110, and 112. The processor 84 contains SCR control software for providing power control signals 126, 128, 130, and 132 to the SCRs 76, 78, 80, and 82 either directly or in a servo control system additionally responsive to the signals 90, 92, 94, and 96 from the voltage and current detectors 98 through 112. This control operation is well known and will not be further described.

One of the operating modes of the processor 84 is the power control mode. In the power control mode, constant power levels are maintained by the processor 84 As explained more completely below in conjunction with FIG. 7, the portion of overall power (or total power) supplied to the heater lamps of each of the four temperature control zones is held at fixed ratios with respect to the other three zones in response to the power set point 118, the top inner/outer power ratio 120, the bottom inner/outer power ratio 122 and/or the top/bottom power ratio 120. These signals 118, 120, and 122 are generated in response to corresponding values entered into the processor 84 via a keyboard (not shown) or from the software task invoking the power control mode.

Another of the operating modes is the temperature control mode. In the temperature control mode, a power set point is maintained by the processor 84 comparing one or both of the sensor signals 86 and 88 to the temperature set point 114 and possibly the temperature differential 116 and in response to such comparison generating the power control signals 126, 128, 130, and 132. The temperature set point 114, temperature differential 116, and temperature ramp rate 127 are generated in response to values entered via the keyboard by the operator or given by the invoking software task. The temperature control mode is divided into two submodes: the steady state submode, and the ramp up submode.

Figure 4:
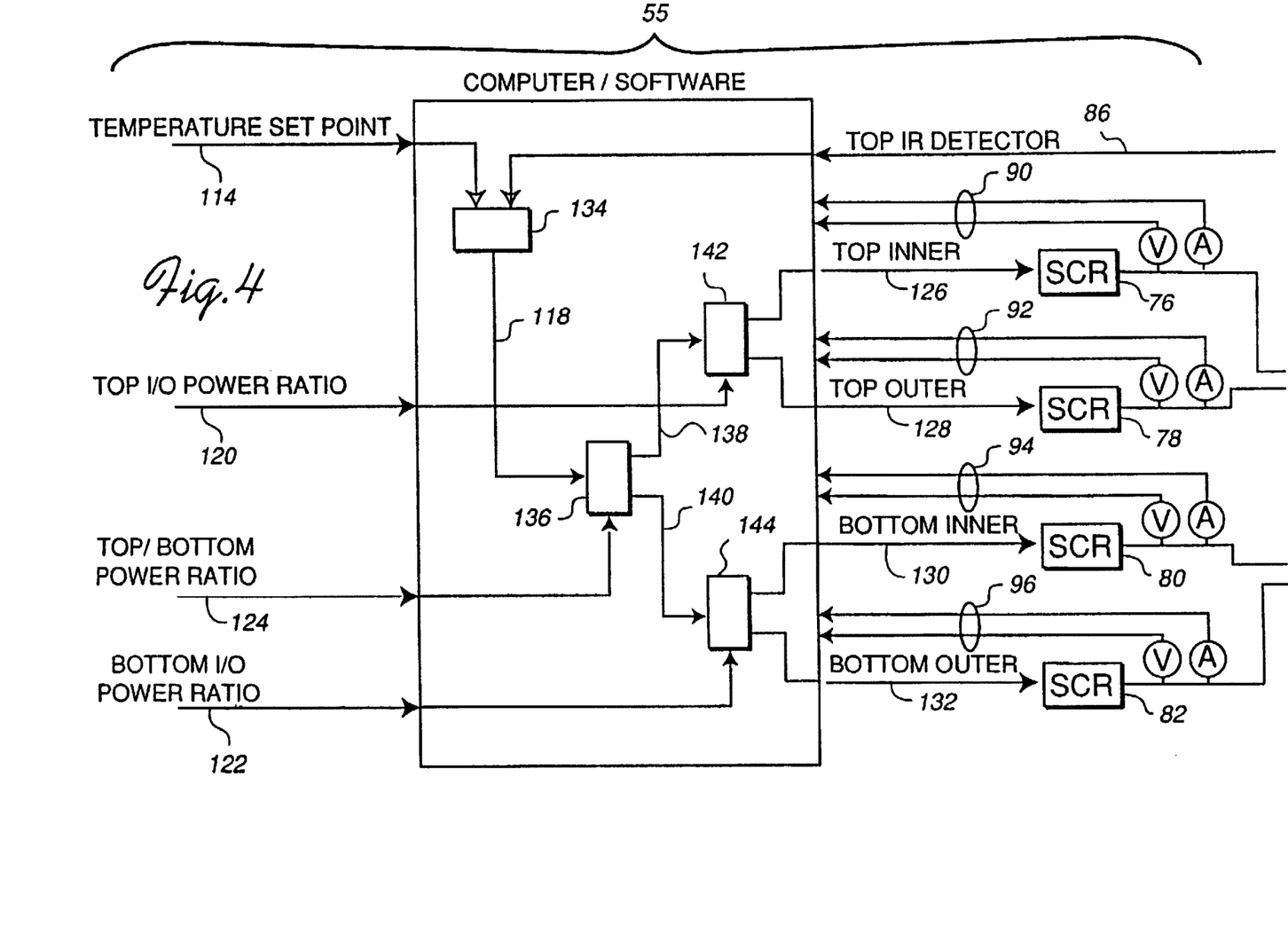
FIG. 4 is a detailed block diagram of the control system of FIG. 3 wherein the control system is configured for steady state temperature controlled operation.

Referring to FIG. 4, a detailed block diagram of the control system 55 with control signals appropriate for one embodiment of the steady state submode of the temperature control mode. The control system block diagrams are to be understood as being functional and can be implemented in software rather than by logic circuits. The temperature set point 114 in the steady state submode is the steady state temperature value entered through the keyboard by the operator or as dictated by an overall control program. Either the operator or overall control program also enters a top inner/outer power ratio 120, a bottom inner/outer power ratio 122, and a top/bottom power ratio 124. For production processing, the temperature set point and the power ratios are part of the usually empirically derived production recipe producing optimal results.

As shown, the temperature set point 114 indicative of the desired steady state processing temperature is compared at block 134 with the upper sensor signal 86, which indicates the actual processing temperature on the upper surface of the substrate. The temperature difference produced by the comparison is used as input to a servo control algorithm to produce the power set signal 118. The servo control algorithm may include proportional, integral, and differential terms, i.e., PID servo control, as is well known in control theory. In block 136, the power set signal 118 is multiplied by appropriate functions of the top/bottom power ratio 124 to produce the upper and lower power signals 138 and 140 representing the power to be applied to the upper and lower heaters 19 and 21 respectively. In block 142, the upper power signal 138 is multiplied by the appropriate functions of the top inner/outer power ratio signal 120 to produce the top inner power control signal 126 and top outer power control signal 128 respectively controlling SCRs 76 and 78. Similarly, in block 144, the lower power signal 140 is multiplied by the appropriate functions of the bottom inner/outer power ratio signal 122 to produce the bottom inner power control signal 130 and bottom outer power control signal 132 respectively controlling SCRs 80 and 82. The outputs of the SCRs 76 and 78 control the inner and outer zone lamps 21 respectively in the upper heater 19 while the SCRs 80 and 82 control the inner and outer zone lamps 21 respectively in the lower heater.

Thus, the power control signals 126, 128, 130, and 132 are generated in response to the preset temperature set point, indicative of the desired processing temperature on the upper surface of the substrate, and the preset power ratios, indicative of empirical heat profiles, both radial and from top to bottom, optimized to achieve this temperature and to optimize production.

Figure 5:
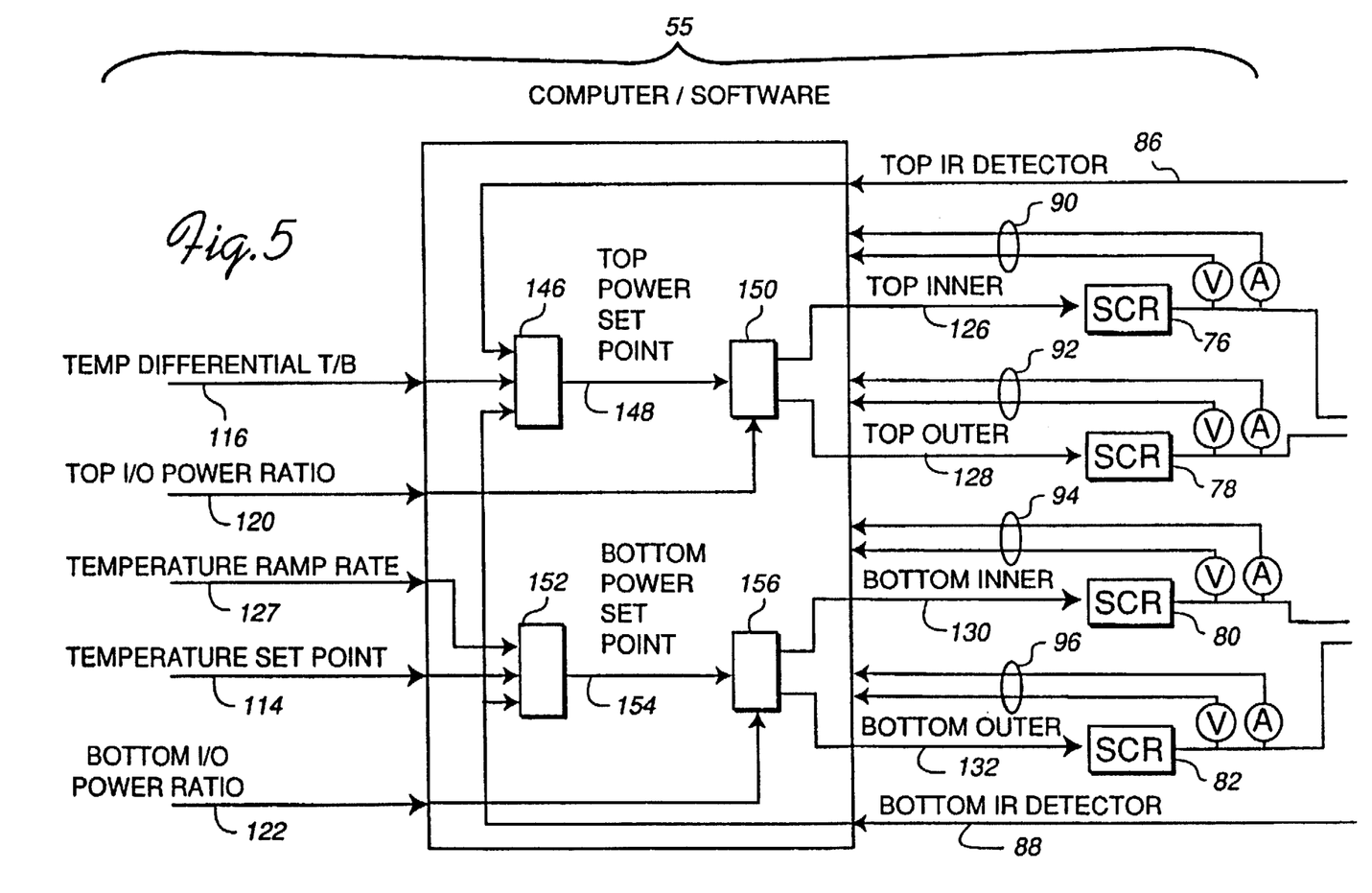
FIG. 5 is a detailed block diagram of the control system of FIG. 3 wherein the control system is configured for temperature controlled ramp up operation.

Referring next to FIG. 5, a detailed block diagram of the control system 55 is shown as it is configured in the ramp up submode of the temperature control mode. In this submode of operation, the temperature set point signal is generated by the processor based upon both a prescribed steady state temperature value 114 and a temperature ramping rate value 127, either entered by the operator or dictated by the overall control program. Typically, the substrate is kept slightly cooler than the susceptor so that, when the final temperature is reached, the entire substrate uniformly arrives at that temperature. The steady state temperature value 114 defines the temperature at which the temperature control software will automatically switch from the ramp up submode to the steady state submode. The temperature ramping rate value 127 indicates the time rate of change at which the substrate is to heat from, for example, room temperature to the final processing temperature. Thus, the temperature set point signal in the ramp up submode is a continuously increasing temperature increasing at, for example, a rate of 10° C./s. The same approach could be used in a ramp down submode, but it is felt to not be necessary.

The operator or overall control program also enters the top/bottom temperature differential signal 116, indicative of the desired difference in temperature between the upper surface of the substrate and the lower surface of the susceptor during a temperature ramp up, and also enters the top and bottom inner/outer power ratios.

Block 152 compares the temperature signal 88 sensed on the bottom of the susceptor to the temperature set point signal at the present time on the ramp and using a servo control algorithm produces a bottom power set point signal 154, which block 156 multiples by respective functions of the bottom inner/outer power ratio signal 122 to produce bottom inner and outer power control signals 130 and 132 controlling the SCRs 80 and 82. Thereby, the lower heating apparatus 21 controlled by these SCRs heat the bottom of the susceptor to the desired temperature.

In the ramp up submode, the upper heater 19 follows the lower heater 21 and initially generates little heat. In block 146, the difference between the upper and lower bottom sensor signals 86 and 88 provides the measured temperature differential, which is then compared to the preset top/bottom temperature differential signal 116. Using a servo control algorithm, block 146 calculates a top power set point signal 148, which block 150 multiplies by respective functions of the top inner/outer power ratio to produce top inner and outer power control signals 126 and 128 respectively controlling SCRs 76 and 78. It is noted that the upper heater apparatus 19 controlled by the described logic thus is driven only by the temperature differential and not the actual temperature.

Thus, the power control signals 126, 128, 130, and 132 are generated in response to (1) the temperature set point, which over time reflects the desired temporal ramping rate, (2) the upper/lower temperature differential signal, indicative of the desired temperature differential between the top of the substrate and the bottom of the susceptor, (3) the top and bottom inner/outer power ratios, and (4) the temperatures sensed on the top of the wafer and the bottom of the susceptor. Such control thus effectively controls both a profile between the front and the back and a profile over time. The front-to-back temperature differential is particularly useful for assuring that the substrate arrives at the steady state temperature with a more uniform radial temperature profile.

The preceding explanation provides an understanding of the essentials of the invention, but its software implementation will now be discussed. The equipment for which the invention was developed is a multichamber platform, only one chamber of which has been discussed. At the present time, a single computer controls all the chambers, but a distributed processing system is possible.

Figure 6:
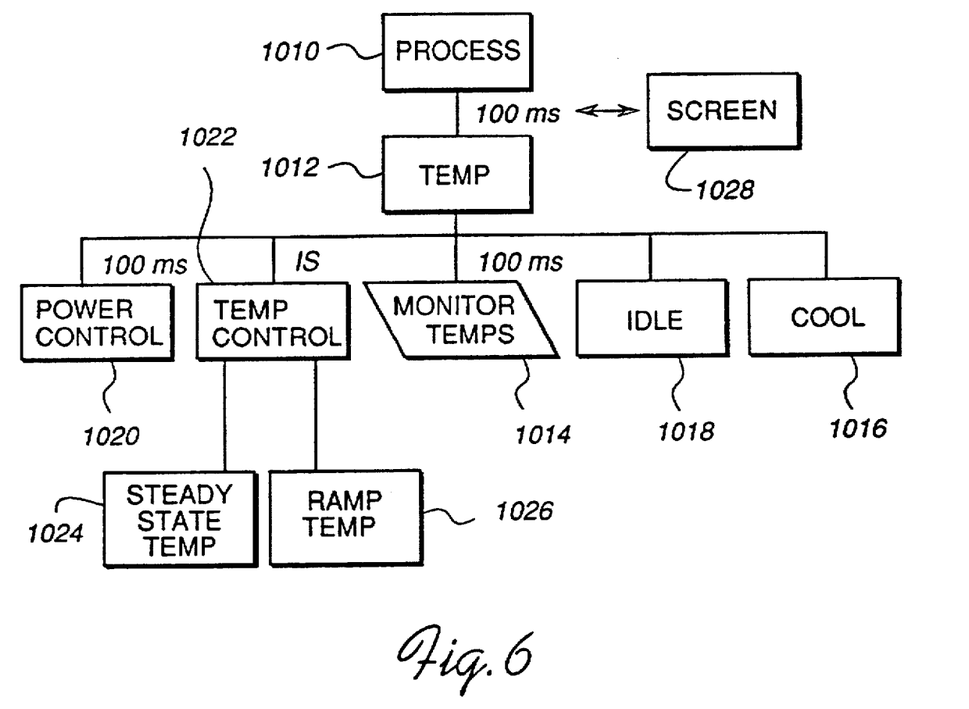
FIG. 6 is a hierarchical software specification of the control system of FIG. 3 for the present invention.

A high-level view of the software for one chamber is illustrated in FIG. 6. A process control task 1010 controls a temperature control task 1012 and initiates it every 100 ms. The temperature control task 1012 in step 1014 monitors the temperature sensed above and below the chamber every 100 ms. It also has a number of operating modes including a cooling task 1016 that is not relevant to the heating and temperature maintenance of the present disclosure. An idle mode 1018 is entered upon start up and at other times when no lamp heating is required. The two main modes of interest to this disclosure is a power control mode 1020, invoked every 100 ms when active, and a temperature control mode 1022, invoked every 1 s when active. The temperature control mode 1022 is divided into two submodes, a steady-state temperature mode 1024 and a ramp temperature mode 1026, both to be described later. In fact, the described temperature control submodes are a subset of a larger set of submodes classified according to which of the temperatures are being monitored and whether the temperatures are being held constant over time. The two temperature submodes discussed below are the most important for understanding of the present invention. A screen task 1028 conveys and receives information from the process task 1010 and the temperature task 1012.

Figure 7:
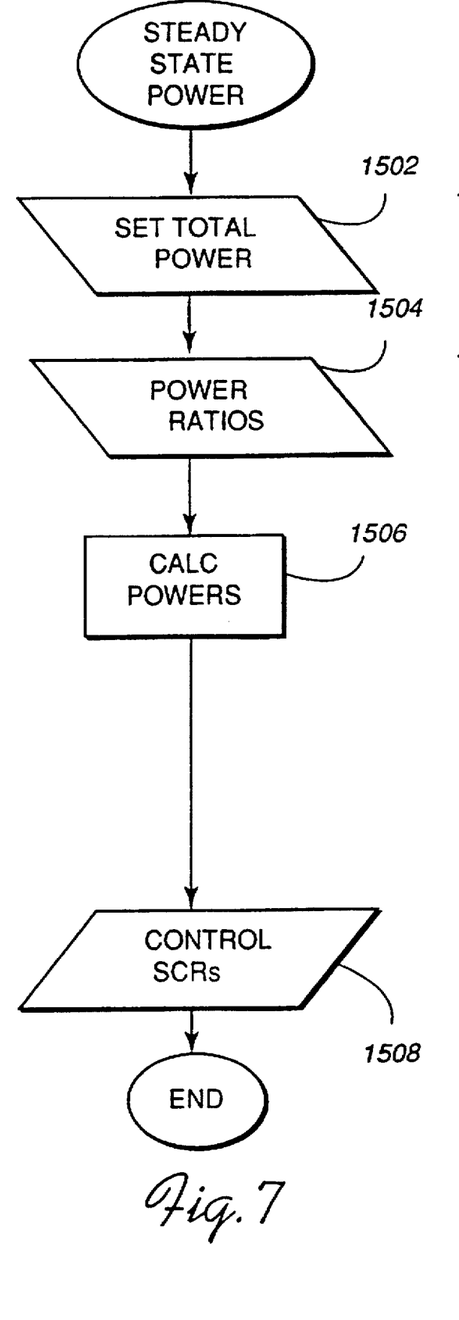
FIG. 7 is a flow diagram of a power control task that may be utilized in the software of FIG. 6.

A sample flow diagram of the steady state power control task is illustrated in FIG. 7 that may be utilized to maintain constant power without reference to the temperature sensors. In step 1502 the total power set point is input and in step 1504 the power ratios are input either by the operator or from the overall control program. The power levels for each of the heating zones are calculated in step 1506 from the total power and the power ratios. In step 1508, the usual SCR control system controls the four SCRs according to the calculated powers. If the steady state control task 1024 is invoked for each cycle by the temperature task 1022, then the control task 1024 terminates for that cycle. However, if the steady state temperature control task 1024 is continuously executing, at least the latter portion of the task reexecutes after a delay corresponding to the control cycle period and the task may be interrupted by the command task 1010, 1012, or 1022.

Figure 8:
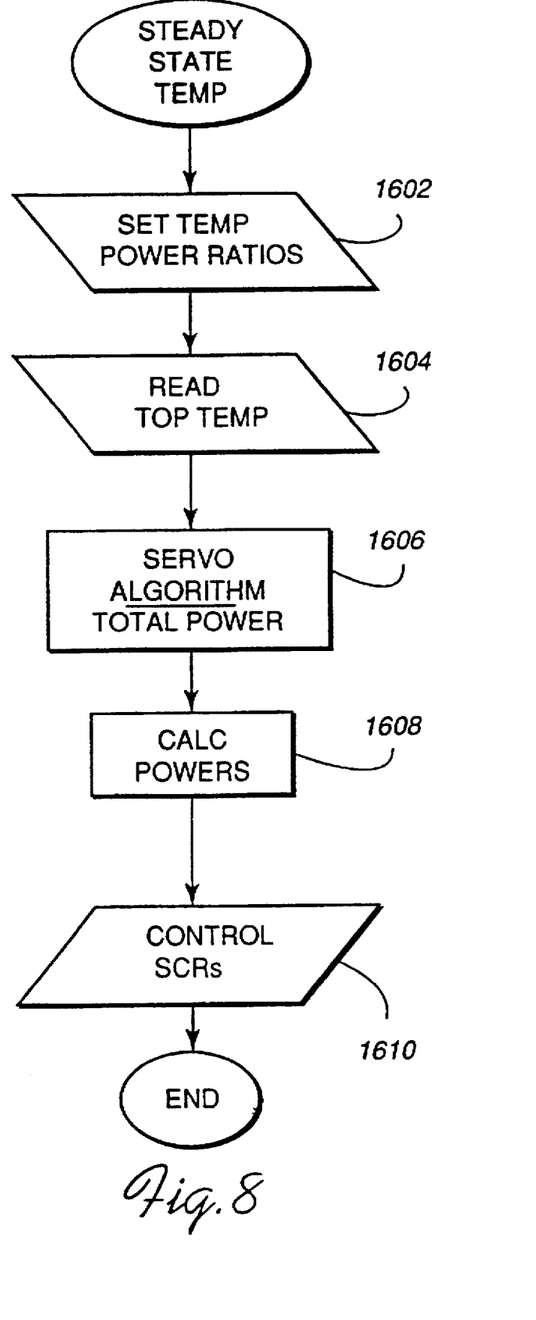
FIG. 8 is a flow diagram of a steady state temperature control task that may be utilized in the software of FIG. 6.

A sample flow diagram of the steady state submode of the temperature control task is illustrated in FIG. 8 that may be utilized by the temperature servo control task when a steady state temperature is desired. In step 1602, the temperature set point and the power ratios are input from either the operator or the overall control program. In step 1604, the temperature is read from the top sensor 52. In step 1606, the servo algorithm calculates the total power setting based on the set temperature and the read temperature. In PID control, it will be necessary to accumulate temperature readings over a number of read cycles and to provide for a start up procedure. A three-period PID servo control algorithm has been found to be adequate. In step 1608, the power control values are calculated from the calculated total power setting and the power ratio parameters. In step 1610, the SCR control system controls the four SCRs controlling the four heating zones according to the four calculated power control values. The same comments apply to the iterations and terminations as were presented for FIG. 7.

Figure 9:
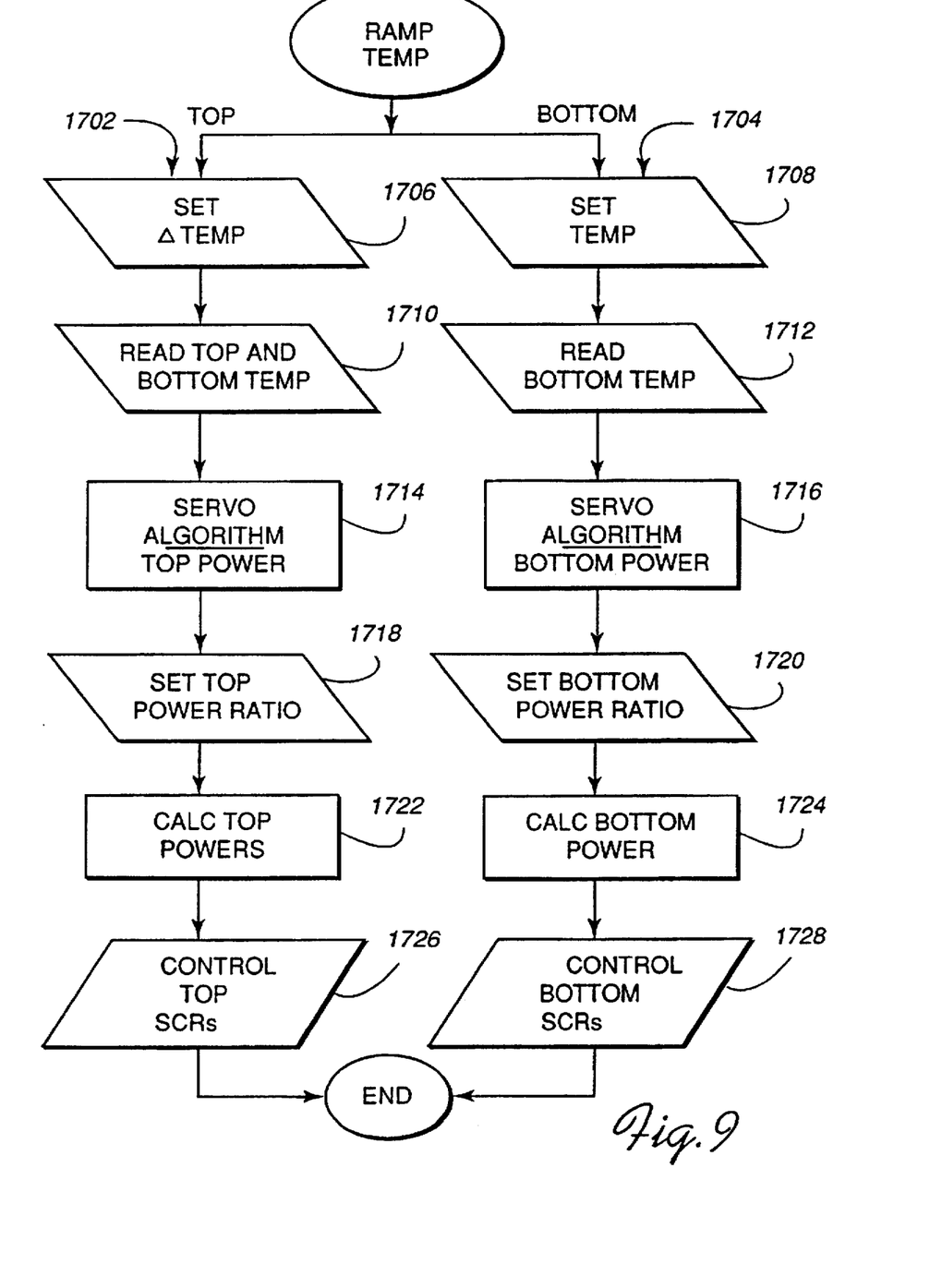
FIG. 9 is a flow diagram of a ramp up temperature control task.

A sample flow diagram of the ramp up submode of the temperature control task is illustrated in FIG. 9. The flow diagram is divided into two parallel streams 1702 and 1704 for control of the top and bottom heaters 19 and 21. The division is pedagogical, and in actual software the two streams 1702 and 1704 would be mostly combined into a single stream of mostly shared operations. In step 1706 of the top stream 1702, the temperature differential between the top and bottom is input from either the operator or command task, and in step 1708 of the bottom stream 1704, the temperature, indicative of the temperature of the susceptor bottom, is similarly input. In steps 1710 and 1712, the actual temperatures on the top and bottom are read. Both top and bottom temperatures are needed in the top stream 1702 to provide the actual differential temperature while only the bottom temperature is needed in the bottom stream 1704 for the primary temperature control. In step 1714, a servo algorithm compares the set temperature differential with the actually measured temperature difference and produces a calculated top power for both the inner and outer zones of the top heat. Likewise, in step 1716, a servo algorithm compares the set temperatures with the actual bottom temperature and produces a calculated bottom power. In view of the distinctly different types of control in the top and bottom streams 1702 and 1704, the two servo algorithms in steps 1714 and 1716 may have distinctly different PID constants.

Thereafter, the two streams 1702 and 1704 proceed similarly. In steps 1718 and 1720, the inner-to-outer power ratios for the top and bottom are set. Of course, these parameters could be set earlier. In steps 1722 and 1724, the inner and outer zone powers on both the top and bottom are calculated from the calculated top and bottom power and the set power ratios. In steps 1726 and 1728, the SCR control system uses the calculated powers to control the respective SCRs.

The described hardware can be used with several obvious variations of the described software. For example, in either of the temperature submodes, it would be possible to use only the upper temperature sensor, only the lower temperature sensor, or both of them. Additional sensors and additional heating zone would provide more control. With additional sensors, the servo algorithm could be more complicated but provide better control. The heater lamps and lamp arrangement may be different than those of the '677 patent.

Thus, the invention can advantageously be used to generate an axial and radial uniformity of temperature within the substrate to control gas flow effects, a controlled radial temperature profile within a substrate to control stress induced slip, and a controlled temperature gradient within the substrate to control the transfer of atoms between the susceptor and the substrate. The additional control can be achieved at low cost with the addition of a second temperature sensor and the coding of the control algorithms described above.

While the invention herein disclosed has been described by means of specific embodiments and applications thereof, numerous modifications and variations could be made thereto by those skilled in the art without departing from the scope of the invention set forth in the claims.

What is claimed is:

1. A method for heating a substrate, comprising the steps of:

supporting a substrate held substantially flat in face-to-face contact with a substantially planar upper surface of a support, a first heating apparatus heating an upper surface of said substrate and said upper surface of said support, a second heating apparatus heating a bottom surface of said support;

sensing a substrate temperature from a first temperature sensor facing said upper surface of said support and sensing a support temperature from a second temperature sensor facing said lower surface of said support;

setting at least one heating parameter;

comparing said at least one heating parameter with said sensed substrate and support temperatures; and in response to said comparing step selectively adjusting said first heating apparatus relative to said second heating apparatus.

2. A method as recited in claim 1, wherein said first and second heating apparatus each have a radially inner zone and a radially outer zone and wherein said adjusting step adjusts said inner and outer zones of each of said heating apparatus to different heating levels.

3. A method as recited in claim 1, wherein said comparing step compares a difference of said substrate temperature and said support temperature with a predetermined non-zero temperature difference and produces a heating value to be applied to said first heating apparatus by said adjusting step.

4. A method as recited in claim 3, wherein said heating value applied to said first heating apparatus depends upon no temperature value other than said difference of said temperatures.

5. A method as recited in claim 1, wherein said comparing step compares said sensed support temperature and derives a second heating value to be applied to said second heating apparatus, said second heating value depending upon no other temperature values than said support sensed temperature.

6. A method as recited in claim 1, wherein said comparing step includes a proportional-integral-differential servo algorithm.

7. A method as recited in claim 1, wherein said setting up sets and resets at different times said at least one heating parameter in response to a desired temperature ramping rate.

8. A method as recited in claim 7, wherein said at least one heating parameter includes a desired non-zero temperature difference between said substrate and support temperatures.

9. A method as recited in claim 7, wherein said desired temperature difference causes said substrate temperature to be lower than said support temperature during the temperature ramping whereby said substrate arrives at a desired steady state temperature with a predetermined lateral temperature profile.

10. A method for heating a substrate, comprising the steps of:

supporting a substrate on an upper surface of a support, a first heating apparatus heating an upper surface of said substrate and said upper surface of said support, a second heating apparatus heating a bottom surface of said support, at least one of said heating apparatus selectively heating a first heating zone on a surface facing thereto relative to a second heating zone on said surface facing thereto;

sensing a substrate temperature with a first temperature sensor and sensing a support temperature with a second temperature sensor;

setting at least one heating parameter;

comparing said at least one heating parameter with both outputs of said two temperature sensors; and in response to said comparing step selectively adjusting a relative heating of said first and second heating zones.

11. A method as recited in claim 10, wherein said setting step sets and resets at different times said at least one heating parameter in response to a desired temperature ramping rate.

12. A method as recited in claim 11, wherein said at least one heating parameter includes a desired non-zero temperature difference between said two temperatures.

13. A method as recited in claim 12, wherein said desired temperature difference causes said substrate temperature to be lower than said support temperature during the temperature ramping whereby said substrate arrives at a desired steady state temperature with a predetermined lateral temperature profile.

14. A method as recited in claim 10, wherein said step of supporting a substrate includes holding said substrate substantially flat on a substantially planar upper surface of said support.

15. A method for heating a substrate, said method comprising the steps of:

supporting a substrate on a top surface of a susceptor, said susceptor having a bottom surface opposite said top surface;

sensing a substrate temperature with a first temperature sensor positioned above said susceptor;

sensing a susceptor temperature with a second temperature sensor positioned beneath said susceptor; and adjusting the heating of a first heater directed toward said top surface of said susceptor relative to the heating of a second heater directed towards said bottom surface as a susceptor in response to said sensed substrate temperature and said sensed susceptor temperature.

16. A method of heating a substrate, said method comprising the steps of:

supporting a substrate on a first surface of a susceptor wherein said susceptor has a second surface opposite said first surface;

heating said substrate and said first surface of said susceptor with a first heat source;

heating said second surface of said susceptor with a second heat source;

sensing a substrate temperature with a first temperature sensor;

sensing a susceptor temperature with a second temperature sensor; and adjusting the heating of said first heat source relative to said second heat source in response to said sensed substrate temperature and said sensed susceptor temperature.

* * * * *